(12) United States Patent
Chon et al.

(10) Patent No.: US 11,059,972 B2
(45) Date of Patent: Jul. 13, 2021

(54) CURABLE ORGANOPOLYSILOXANE COMPOSITION AND OPTICAL SEMICONDUCTOR DEVICE

(71) Applicant: DOW SILICONES CORPORATION, Midland, MI (US)

(72) Inventors: Jina Chon, Chungcheongbuk-do (KR); Ju Young Yook, Chungcheongbuk-do (KR)

(73) Assignee: DOW SILICONES CORPORATION, Midland, MI (US)

(*) Notice: Subject to any disclaimer, the term of this patent is extended or adjusted under 35 U.S.C. 154(b) by 59 days.

(21) Appl. No.: 16/634,811

(22) PCT Filed: Jul. 31, 2018

(86) PCT No.: PCT/US2018/044561
§ 371 (c)(1),
(2) Date: Jan. 28, 2020

(87) PCT Pub. No.: WO2019/027993
PCT Pub. Date: Feb. 7, 2019

(65) Prior Publication Data
US 2021/0087395 A1    Mar. 25, 2021

Related U.S. Application Data (60) Provisional application No. 62/539,138, filed on Jul. 31, 2017.

(51) Int. Cl.
| C08L 83/04 | (2006.01) |
| C08G 77/12 | (2006.01) |
| C08G 77/20 | (2006.01) |
| C08K 3/36  | (2006.01) |
| H01L 23/29 | (2006.01) |
| H01L 33/56 | (2010.01) |

(52) U.S. Cl.
CPC ............. *C08L 83/04* (2013.01); *C08G 77/12* (2013.01); *C08G 77/20* (2013.01); *C08K 3/36* (2013.01); *H01L 23/296* (2013.01); *H01L 33/56* (2013.01); *C08K 2201/006* (2013.01); *C08L 2201/10* (2013.01); *C08L 2203/206* (2013.01); *C08L 2205/02* (2013.01); *C08L 2312/08* (2013.01)

(58) Field of Classification Search
CPC ......... C08L 83/04; C08K 3/36; H01L 23/296; H01L 33/56
See application file for complete search history.

(56) References Cited

U.S. PATENT DOCUMENTS

| 2006/0275617 A1 | 12/2006 | Miyoshi et al. |
| 2011/0098400 A1 | 4/2011 | Blanc-Magnard et al. |
| 2013/0134609 A1* | 5/2013 | Yoshitake ............... H01L 33/56 257/791 |
| 2013/0200554 A1 | 8/2013 | Mueller |

FOREIGN PATENT DOCUMENTS

| EP | 0997498 A1 | 5/2000 |
| FR | 2880029 A1 | 6/2006 |
| JP | 2006342200 A | 12/2006 |
| JP | 200763538 A | 3/2007 |
| JP | 2008120843 A | 5/2008 |
| JP | 2012012434 A | 1/2012 |
| WO | 2017087351 A1 | 5/2017 |

OTHER PUBLICATIONS

International Search Report for PCT/US2018/044561 dated Nov. 6, 2018, 5 pages.
Machine assisted English translation of JP2007063538A obtained from https://patents.google.com/patent on Apr. 28, 2020, 13 pages.
Machine assisted English translation of JP2008120843A obtained from https://patents.google.com/patent on Apr. 28, 2020, 9 pages.

* cited by examiner

*Primary Examiner* — Kuo Liang Peng
(74) *Attorney, Agent, or Firm* — Warner Norcross + Judd LLP (57) ABSTRACT

A curable organopolysiloxane composition that can be used as a sealant or a bonding agent for optical semiconductor elements is disclosed. The composition comprises: (A) an alkenyl-containing organopolysiloxane that comprises constituent (A-1) of an average compositional formula and constituent (A-2) of an average compositional formula; (B) an organopolysiloxane that contains silicon-bonded hydrogen atoms and comprises a constituent (B-1) containing at least 0.5 wt. % of silicon-bonded hydrogen atoms and represented by an average molecular formula, constituent (B-2) containing at least 0.5 wt. % of silicon-bonded hydrogen atoms and represented by an average compositional formula, and, optionally, constituent (B-3) of an average molecular formula; (C) an adhesion promoter; and (D) a hydrosilylation-reaction catalyst. The composition can form a cured body that possesses long-lasting properties of light transmittance and bondability, and relatively high hardness.

7 Claims, 2 Drawing Sheets

| Comparative Example 1 | Comparative Example 2 | Example 1 |
|---|---|---|
| +++ | ++ | No contamination |
|  |  |  |

| Example 2 | Example 3 | Example 4 |
|---|---|---|
| No contamination | No contamination | No contamination |
|  |  |  |

CURABLE ORGANOPOLYSILOXANE COMPOSITION AND OPTICAL SEMICONDUCTOR DEVICE

CROSS-REFERENCE TO RELATED APPLICATIONS

This application is the National State of International Appl. No. PCT/US2018/044561 filed 31 Jul. 2018, which claims priority to and all advantages of U.S. Patent Application No. 62/539,138 filed on 31 Jul. 2017, the content of which is incorporated herein by reference.

TECHNICAL FIELD

The present invention relates to a curable organopolysiloxane composition and to an optical semiconductor device having an optical semiconductor element that is sealed and/or bonded with a cured body of the aforementioned composition.

BACKGROUND ART

Curable organopolysiloxane compositions are used for sealing and/or bonding optical semiconductor elements in optical semiconductor devices having optical semiconductor elements such as photocouplers, light-emitting diodes, solid-state image pickup elements, or the like. It is required that cured bodies of such compositions neither absorb nor scatter the light emitted or received from semiconductor elements. Furthermore, in order to improve reliability of the optical semiconductor devices, it is desired that the cured bodies could not discolor or decrease in the bonding strength.

Japanese Unexamined Patent Application Publication (hereinafter referred to as "Kokai") 2006-342200 discloses a curable organopolysiloxane composition that can form a cured body having high hardness and high light transmittance. However, the cured body produced from such a composition can be either easily damaged during manufacture or use of an optical semiconductor device, or can easily delaminate from the optical semiconductor element or a package of such element.

Kokai 2007-63538 and Kokai 2008-120843 disclose curable organopolysiloxane compositions that can form cured bodies having excellent impact-resistant properties. However, since with the lapse of time such cured bodies are subject to yellowing, they are not suitable for sealing or bonding optical semiconductor elements of optical semiconductor devices that are intended for long-time use at high temperatures.

Kokai 2012-12434 discloses a curable organopolysiloxane composition that can form a cured body having long-lasting properties of light transmittance and bondability, and having relatively high hardness. However, these existing solutions for die attach suffer from causing pad contamination, which results in poor bonding of wire to the pad. Failure to bond wire to the pad would disrupt electric conductivity and failure of the package itself.

It is an object of the present invention to provide a curable organopolysiloxane composition that can form a substantially transparent cured body having long-lasting properties of light transmittance and bondability as well as providing for a more reliable package through low pad contamination. It is another object to provide an optical semiconductor device that possesses excellent reliability and performance.

SUMMARY OF THE INVENTION

The curable organopolysiloxane composition of the invention comprises at least the following components:

(A) an alkenyl-containing organopolysiloxane that comprises 15 to 35 wt. % of constituent (A-1) and 65 to 85 wt. % of constituent (A-2), wherein constituent (A-1) comprises an organopolysiloxane of the following average compositional formula:

where $R^1$ designates phenyl groups, methyl groups, or alkenyl groups having 2 to 10 carbon atoms; 0.4 to 50 mole % of all $R^1$ groups are alkenyl groups having 2 to 10 carbon atoms; methyl groups constitute 90 mole % or more of the sum of methyl and phenyl groups contained in $R^1$; "a", "b", "c", and "d" are numbers that satisfy the following conditions: $0 \leq a \leq 0.05$; $0.9 \leq b \leq 1$; $0 \leq c \leq 0.03$; $0 \leq d \leq 0.03$; and $a+b+c+d=1$;

constituent (A-2) comprises an organopolysiloxane of the following average compositional formula:

where $R^2$ designates phenyl groups, methyl groups, or alkenyl groups having 2 to 10 carbon atoms; 5 to 10 mole % of all $R^2$ groups are alkenyl groups having 2 to 10 carbon atoms; methyl groups constitute 90 mole % or more of the sum of methyl and phenyl groups contained in $R^2$; "e", "f", "g", "h" and "i" are numbers that satisfy the following conditions: $0.4 \leq e \leq 0.6$; $0 \leq f \leq 0.05$; $0 \leq g \leq 0.05$; $0.4 \leq h \leq 0.6$; $0.01 \leq i \leq 0.05$; and $e+f+g+h=1$;

(B) an organopolysiloxane that contains silicon-bonded hydrogen atoms and comprises 80 to 100 wt. % of constituent (B-1), 0 to 20 wt. % of constituent (B-2), and 0 to 10 wt. % of constituent (B-3), the proportion of each of (B-1), (B-2), and (B-3) selected so that they add up to 100 wt. %, and in an amount that the silicon-bonded hydrogen atoms in component (B) are in the range of 0.5 to 2.0 moles per 1 mole of the total content of alkenyl groups in component (A), wherein constituent (B-1) comprises an organopolysiloxane that contains at least 0.5 wt. % of silicon-bonded hydrogen atoms and that is represented by the following average molecular formula:

where $R^3$ designates phenyl groups or methyl groups; methyl groups constitute 90 mole % or more of all groups contained in $R^3$; "j" is a number in the range of 0 to 35; and "k" is a number in the range of 10 to 100;

constituent (B-2) comprises an organopolysiloxane that contains at least 0.5 wt. % of silicon-bonded hydrogen atoms and that is represented by the following average compositional formula:

where $R^4$ designates phenyl groups or methyl groups; methyl groups constitute 90 mole % or more of all groups contained in $R^4$; $R^5$ designates hydrogen atoms or alkyl groups having 1 to 10 carbon atoms; and "l", "m", "n", "o", "p" and "q" are numbers that satisfy the following conditions: $0.4 \leq l \leq 0.7$; $0 \leq m \leq 0.2$; $0 \leq n \leq 0.05$; $0 \leq o \leq 0.5$; $0.3 \leq p \leq 0.6$; $0 \leq q \leq 0.05$; and $l+m+n+o+p=1$;

constituent (B-3) is an organopolysiloxane represented by the following average molecular formula:

where $R^6$ represents phenyl groups or methyl groups; methyl groups constitute at least 90% of all groups contained in $R^6$; and "r" is a number in the range of 10 to 100;

(C) an adhesion promoter, in an amount of 0.1 to 5 parts by weight per 100 parts by weight of the sum of components (A) and (B); and (D) a hydrosilylation-reaction catalyst, in an amount sufficient for curing the composition.

The composition of the invention may be further provided with (E) fumed silica having BET specific area of 20 to 200 m²/g and added in an amount of 1 to 10 parts by weight per 100 parts by weight of the sum of components (A) to (D).

When the composition of the invention is cured, it forms a substantially optically transparent cured body that has a type D durometer hardness in the range of 30 to 70 according to JIS K 6253 and that is suitable for use as an agent for sealing or bonding optical semiconductor elements, in particular light emitting diodes.

The optical semiconductor device of the present invention is characterized by having optical semiconductor elements sealed and/or bonded with the use of cured bodies of the aforementioned composition.

Effects of Invention

The curable organopolysiloxane composition of the present invention is characterized by forming a cured body having long-lasting properties of light transmittance and bondability, and having relatively high hardness. The optical semiconductor device of the invention is characterized by excellent reliability achieved in part by reduced wire bond failure.

BRIEF DESCRIPTION OF THE DRAWINGS

Reference Numerals Used in the Description 1 housing made from polyphthalamide resin
2 inner lead
3 die pad
4 bonding material
5 LED chip
6 bonding wire
7 sealing material

DETAILED DESCRIPTION OF THE INVENTION

Component (A), which is the main component of the composition of the invention, comprises an alkenyl-containing organopolysiloxane that consists of constituents (A-1) and (A-2) which are described below.

Constituent (A-1) is used for improving handleability of the composition and mechanical strength of a cured body. This constituent comprises an organopolysiloxane of the following average compositional formula:

$(R^1{}_3SiO_{1/2})_a(R^1{}_2SiO_{2/2})_b(R^1SiO_{3/2})_c(SiO_{4/2})_d$ where $R^1$ designates phenyl groups, methyl groups, or alkenyl groups having 2 to 10 carbon atoms. The alkenyl groups of $R^1$ can be represented by vinyl, allyl, butenyl, pentenyl, or hexenyl groups. Vinyl groups are preferable in view of their reactivity and ease of synthesis. However, 0.4 to 50 mole % of all $R^1$ groups are alkenyl groups. This is because if the content of the alkenyl groups is below the recommended lower limit, a cured body of the composition will have low mechanical strength, and if, on the other hand, the content of the alkenyl group exceeds the recommended upper limit, a cured body will become brittle. Furthermore, when the sum of methyl groups and phenyl groups of $R^1$ is assumed as 100%, the methyl groups should constitute 90 mole % of more. This is because if the content of methyl groups is below the recommended lower limit, a cured body of the composition can easily acquire a color at a high temperature. Furthermore, in the above formula, "a", "b", "c", and "d" are numbers that represent ratios of siloxane structural units, and that satisfy the following conditions: $0 \le a \le 0.05$; $0.9 \le b \le 1$; $0 \le c \le 0.03$; $0 \le d \le 0.03$; and $a+b+c+d=1$. If the value of "a" exceeds the recommended upper limit, this will lead to significant decrease in viscosity of this constituent. This, in turn, will either impair handleability of the composition and make the present constituent volatile, or will decrease the weight of the composition during curing and reduce hardness of the cured body. If, on the other hand, the values of "c" and "d" exceed the recommended upper limit, this will increase viscosity of the present constituent, and will either impair handleability of the composition, or will make the cured body too brittle. The value of "b" is determined from the values of "a", "c", and "d". However, if the value of "b" is lower than the recommended lower limit, it will be impossible to impart either desired viscosity to the composition or a required hardness or mechanical strength to a cured body. Constituent (A-1) may have a linear, cyclic, partially cyclic, or a partially branched molecular structure. This constituent is liquid at 25° C. The viscosity of this constituent at 25° C. should be in the range of 3 to 1,000,000 mPa·s, and alternatively 5 to 50,000 mPa·s. If the viscosity is below the recommended lower limit, this will reduce mechanical strength of a cured body, and, if, on the other hand, the viscosity exceeds the recommended upper limit, this will impair handleability of the composition.

Constituent (A-1) may be represented by organopolysiloxanes expressed by the average compositional formulas given below, where Vi stands for vinyl, Me stands for methyl, and Ph stands for phenyl.

$(ViMe_2SiO_{1/2})_{0.012}(Me_2SiO_{2/2})_{0.988}$ $(ViMe_2SiO_{1/2})_{0.007}(Me_2SiO_{2/2})_{0.993}$ $(Me_3SiO_{1/2})_{0.007}(Me_2SiO_{2/2})_{0.983}(MeViSiO_{2/2})_{0.010}$ $(Me_3SiO_{1/2})_{0.001}(MeSiO_{1/2})_{0.01}(Me_2SiO_{2/2})_{0.96}(MeSiO_{3/2})_{0.02}$ $(ViMe_2SiO_{1/2})_{0.005}(Me_2SiO_{2/2})_{0.895}(MePhSiO_{2/2})_{0.1001}$

Furthermore, constituent (A-1) may be represented by organopolysiloxanes expressed by the average molecular formulas given below, Vi and Me are the same as defined above.

$(MeViSiO_{2/2})_3$ $(MeViSiO_{2/2})_4$

$(MeViSiO_{2/2})_5$

Constituent (A-2) is an organopolysiloxane that is intended for imparting hardness and mechanical strength to a cured body of the composition. This constituent is represented by the following average compositional formula:

$(R^2{}_3SiO_{1/2})_e(R^2{}_2SiO_{2/2})_f(R^2SiO_{3/2})_g(SiO_{4/2})_h(HO_{1/2})_i$

In this formula, $R^2$ designates phenyl groups, methyl groups, or alkenyl groups having 2 to 10 carbon atoms. The alkenyl groups of $R^2$ can be represented by vinyl, allyl, butenyl, pentenyl, or hexenyl groups. Vinyl groups are preferable in view of their reactivity and ease of synthesis. However, 5 to 10 mole % of all $R^2$ groups are alkenyl groups. This is because if the content of the alkenyl groups is below the recommended lower limit, a cured body of the composition will have low hardness and mechanical strength, and if, on the other hand, the content of the alkenyl group exceeds the recommended upper limit, a cured body will become brittle. Furthermore, when the sum of methyl groups and phenyl groups of $R^2$ is assumed as 100%, the methyl groups should constitute 90 mole % of more. This is because if the content of methyl groups is lower than the recommended limit, a cured body of the composition can easily acquire a color at a high temperature. Furthermore, in the above formula, "e", "f", "g", "h" and "i" are numbers that represent ratios of siloxane structural units and hydroxyl groups, and that satisfy the following conditions: $0.4 \le e \le 0.6$; $0 \le f \le 0.05$; $0 \le g \le 0.05$; $0.4 \le h \le 0.6$; $0.01 \le i \le 0.05$; and $e+f+g+h=1$. If the value of "e" is below the recommended lower limit, this will reduce mechanical strength of a cured body, and if, on the other hand, the value of "e" exceeds the recommended upper limit, it will be impossible to impart to a cured body a sufficient hardness. If the value of "f" exceeds the recommended upper limit, it will be impossible to impart to a cured body a sufficient hardness. If the value of "g" exceeds the recommended upper limit, this will lower mechanical strength of a cured body. If the value of "h" is below the recommended lower limit, it will be impossible to impart to a cured body a sufficient hardness, and if, on the other hand, the value of "h" exceeds the recommended upper limit, it will impair dispersibility of the component in the composition and will reduce mechanical strength of a cured body of the composition. Finally, in order to provide the composition with good bondability, it is important to maintain the value of "i" within the recommended range. If the value of "i" is below the recommended lower limit, it will be impossible to provide the composition with desired bonding properties, and if, on the other hand, the value of "i" exceeds the recommended upper limit, this will impair dispersibility of this constituent in the composition and will not allow imparting desired mechanical strength and bonding properties to a cured body of the composition. Constituent (A-2) may have a branched or net-like molecular structure. There are no special restrictions with regard to viscosity of this constituent at 25° C. and it may be liquid or solid provided that it is miscible with constituent (A-1).

Constituent (A-2) may be represented by organopolysiloxanes expressed by the average compositional formulas given below, where Vi, Me, and Ph are the same as defined above.

$(ViMe_2SiO_{1/2})_{0.10}(Me_3SiO_{1/2})_{0.33}(SiO_{4/2})_{0.57}$
$(HO_{1/2})_{0.03}$ $(ViMe_2SiO_{1/2})_{0.13}(Me_3SiO_{1/2})_{0.35}(SiO_{4/2})_{0.52}$
$(HO_{1/2})_{0.02}$ $(ViMePhSiO_{1/2})_{0.10}(Me_3SiO_{1/2})_{0.45}(SiO_{4/2})_{0.45}$
$(HO_{1/2})_{0.03}$ $(ViMe_2SiO_{1/2})_{0.09}(Me_3SiO_{1/2})_{0.31}(SiO_{4/2})_{0.60}$
$(HO_{1/2})_{0.04}$ $(ViMe_2SiO_{1/2})_{0.10}(Me_3SiO_{1/2})_{0.40}(SiO_{4/2})_{0.50}$
$(HO_{1/2})_{0.03}$

It is recommended that component (A) contains 15 to 35 wt. % of constituent (A-1) and 65 to 85 wt. % of constituent (A-2), and alternatively 20 to 30 wt. % of constituent (A-1) and 70 to 80 wt. % of constituent (A-2). If the content of constituent (A-1) exceeds the recommended upper limit, it will be impossible to impart a desired hardness and mechanical strength to a cured body of the composition, and if, on the other hand, the content of constituent (A-1) is below the recommended lower limit, this will impair handleability of the composition and impart brittleness to a cured body.

It is not necessary to premix constituents (A-1) and (A-2) of component (A) if the composition can be eventually prepared in a state of high uniformity. From the viewpoint of good handleability, component (A) should be liquid at 25° C. and have a viscosity in the range of 100 to 5,000,000 mPa·s, and alternatively 500 to 100,000 mPa·s.

Component (B) is used in the composition as a cross-linking agent. It comprises an organopolysiloxane that has silicon-bonded hydrogen atoms and consists of constituents (B-1), and in some cases constituent (B-2) and/or constituent (B-3).

Constituent (B-1) is the main constituent of Component (B), and acts not only as a cross-linking agent but also as an efficient interfacial bonding improver. Component (B) may constitute only of constituent (B-1) as the cross-linking agent. This constituent comprises an organopolysiloxane that is represented by the following average molecular formula:

$R^3_3SiO(R^3_2SiO)_j(R^3HSiO)_kSiR^3_3$

In this formula, $R^3$ designates phenyl groups or methyl groups; methyl groups constitute 90 mole % or more of all groups contained in $R^3$. If the content of methyl groups is below the recommended limit, a cured body will acquire a color at a high temperature. In this formula, "j" is a number in the range of 0 to 35; and "k" is a number in the range of 5 to 100. If the value of "j" exceeds the recommended upper limit, it will be impossible to provide the composition with good bondability. If the value of "k" is below the recommended lower limit, it will be impossible to provide the composition with good bondability, and if, on the other hand, the value of "k" exceeds the recommended upper limit, a cured body will be obtained with low mechanical strength. Furthermore, the content of silicon-bonded hydrogen atoms should be equal to or greater than 0.5 wt. %. If the content of silicon-bonded hydrogen atoms is below 0.5 wt. %, it will be difficult to provide the composition with good bondability. It is recommended that constituent (B-1) be liquid at 25° C. and have viscosity at 25° C. in the range of 3 to 10,000 mPa·s, and alternatively 5 to 5,000 mPa·s. If the viscosity is below the recommended lower limit, a cured body, this will impair mechanical strength and bonding strength, and if, on the other hand, the viscosity exceeds the recommended upper limit, this will impair handleability of the composition.

Constituent (B-1) may be represented by organopolysiloxanes expressed by the average molecular formulas given below, where Me and Ph are the same as defined above.

$Me_3SiO(MeHSiO)_{10}SiMe_3$ $Me_3SiO(MeHSiO)_{80}SiMe_3$ $Me_3SiO(Me_2SiO)_{30}(MeHSiO)_{30}SiMe_3$ $Me_2PhSiO(MeHSiO)_{35}SiMe_2Ph$

Constituent (B-2) and constituent (B-3) may be added to constituent (B-1) for varying the physical properties of Composition (B) to suit a particular usage condition. Constituent (B-2) may be added for improving mechanical strength of a cured body as well as aggregation and bonding properties. Constituent (B-2) comprises an organopolysiloxane that is represented by the following average compositional formula:

$$(HR^4{}_2SiO_{1/2})_l(R^4{}_3SiO_{1/2})_m(R^4{}_2SiO_{2/2})_n(R^4SiO_{3/2})_o(SiO_{4/2})_p(R^5O_{1/2})_q$$

In this formula, $R^4$ designates phenyl groups or methyl groups. Methyl groups constitute 90 mole % or more of all groups contained in $R^4$. If the content of methyl groups is below the recommended limit, this may color the cured body at a high temperature. In the above formula, $R^5$ designates hydrogen atoms or alkyl groups having 1 to 10 carbon atoms. The alkyl groups of $R^5$ having 1 to 10 carbon atoms are represented by methyl, ethyl, and isopropyl groups. Furthermore, in the formula, "l", "m", "n", "o", "p" and "q" are numbers that represent ratios of siloxane structural units and hydroxyl groups or alkoxy groups, and that satisfy the following conditions: $0.4 \leq l \leq 0.7$; $0 \leq m \leq 0.2$; $0 \leq n \leq 0.05$; $0 \leq o \leq 0.5$; $0.3 \leq p \leq 0.6$; $0 \leq q \leq 0.05$; and $l+m+n+o+p=1$. If the value of "l" is below the recommended lower limit, it will be impossible to achieve a desired hardness, and if, on the other hand, the value of "l" exceeds the recommended upper limit, this will reduce molecular weight of the present constituent and will not allow imparting a sufficient mechanical strength to a cured body. Furthermore, if the value of "m" exceeds the recommended upper limit, it will be impossible to achieve a desired hardness. If the value of "n" exceeds the recommended upper limit, it will be impossible to achieve a desired hardness. If the value of "o" exceeds the recommended upper limit, this will impair dispersibility of the constituent and will not allow imparting a sufficient mechanical strength to a cured body. If the value of "p" is below the recommended lower limit, it will be impossible to achieve as a desired hardness, and if, on the other hand, the value of "p" exceeds the recommended upper limit, this will impair dispersibility of the present constituent in the composition and will not allow obtaining a desired mechanical strength. Finally, if the value of "q" exceeds the recommended upper limit, this will reduce molecular weight of the constituent and will not allow imparting a sufficient mechanical strength to a cured body. The present constituent should contain at least 0.5 wt. % of silicon-bonded hydrogen atoms. If the content of silicon-bonded hydrogen atoms is below 0.5 wt. %, it will be impossible to impart sufficient mechanical strength to a cured body. In order to improve miscibility of the present constituent with the composition, this constituent should be liquid or solid at 25° C.

Constituent (B-2) may be represented by organopolysiloxanes expressed by the average compositional formulas given below, where Me and Ph are the same as defined above.

$$(HMe_2SiO_{1/2})_{0.67}(SiO_{4/2})_{0.33}$$

$$(HMe_2SiO_{1/2})_{0.50}(Me_3SiO_{1/2})_{0.17}(SiO_{4/2})_{0.33}$$

$$(HMe_2SiO_{1/2})_{0.65}(PhSiO_{3/2})_{0.05}(SiO_{4/2})_{0.30}$$

Constituent (B-3) is used for controlling hardness of a cured body. This constituent is an organopolysiloxane represented by the following average molecular formula:

$$HR^6{}_2SiO(R^6{}_2SiO)_rSiR^6{}_2H$$

where $R^6$ designates phenyl or methyl groups and where methyl groups constitute at least 90% of all groups contained in $R^6$. If the content of methyl groups is below the recommended lower limit, this will color a cured body at a high temperature. In the above formula, "r" designates a number in the range of 10 to 100. If "r" is below the recommended lower limit, it will be difficult to provide a cured body with a desired hardness, and if, on the other hand, the value of "r" exceeds the recommended upper limit, a cured body will lose its mechanical strength.

Constituent (B-3) can be exemplified by organopolysiloxanes that are expressed by the following average molecular formulas, where Me and Ph are the same as defined above:

$$HMe_2SiO(Me_2SiO)_{20}SiMe_2H$$

$$HMe_2SiO(Me_2SiO)_{80}SiMe_2H$$

$$HMe_2SiO(Me_2SiO)_{50}(MePhSiO)_5SiMe_2H$$

Component (B) contains 80 to 100 wt. % of constituent (B-1), 0 to 20 wt. % of constituent (B-2), and 0 to 10 wt. % of constituent (B-3), shown as a relative percentage to the total weight of Component (B). In various embodiments, constituent (B-1) may comprise at least 85, 90, or 95 wt. % of Component (B). Constituent (B-2) may be present and comprise an amount in a range where the lower end of the range may be 0 wt. %, at least 5, 10, or 15 wt. %, and the higher end of the range is higher than the lower end of the range but no more than 5, 10, 15, or 20 wt. % of the total amount of Component (B). Constituent (B-3) may be present and comprise the remainder of Component (B) relative to constituent (B-1) and constituent (B-2). Typically, the amount of constituent (B-3) is low, in order for the cured body of the composition of the invention to have sufficient hardness. The described composition of Component (B) reduces pad contamination by the siloxane material creeping onto the pad. Component (B) is liquid at 25° C. and have a viscosity in the range of 5 to 100,000 mPa·s, and alternatively 10 to 50,000 mPa·s, which makes Component (B) easy to handle.

Component (B) is added in such an amount that the silicon-bonded hydrogen atoms are in the range of 0.5 to 2.0 moles, and alternatively 0.8 to 1.8 moles, per 1 mole of the total content of alkenyl groups in component (A). If the content of component (B) is below the recommended lower limit, or exceeds the recommended upper limit, it will be impossible to impart to a cured body of the composition the desired hardness, mechanical characteristics, and bonding properties.

Component (C) is an adhesion promoter. Such an adhesion promoter may be one known in the art and used for addition to hydrosilylation-reaction curable organopolysiloxane compositions. An exemplary Component (C) is an organosilane or organosiloxane that contains epoxy-containing organic group, alkenyl group and silicon-bonded alkoxy group. Component (C) may be exemplified by the following compounds: organosilanes or organosiloxane oligomers having 4 to 20 silicon atoms and a linear, branched, or cyclic molecular structure and containing trialkoxysiloxy groups (such as trimethoxysiloxy groups or triethoxysiloxy groups) or trialkoxysilylalkyl groups (such as trimethoxysilylethyl groups or triethoxysilylethyl groups) and hydrosilyl groups or alkenyl groups (such as vinyl groups or allyl groups); organosilanes or organosiloxane oligomers having 4 to 20 silicon atoms and a linear, branched, or cyclic molecular structure and containing trialkoxysiloxy groups or trialkoxysilylalkyl groups and methacryloxyalkyl groups (such as 3-methacryloxypropyl groups); organosilanes or organosiloxane oligomers having 4 to 20 silicon atoms and a linear, branched, or cyclic molecular structure and containing trialkoxysiloxy groups or trialkoxysilylalkyl groups and epoxy-containing alkyl groups (such as 3-glycidoxypropyl groups, 4-glycidoxybutyl groups, 2-(3,4-epoxycyclohexyl) ethyl groups, or 3-(3,4-epoxycyclohexyl)propyl groups); reaction products of am inoalkyltrialkoxysilane and epoxy-bonded alkyltrialkoxysilane; or epoxy-containing ethylpolysilicate. Specific examples are the following compounds: vinyltrimethoxysilane, allyltrimethoxysilane, allyltriethoxysilane, hydrogentriethoxysilane, 3-glycidoxypropyltrimethoxysilane, 3-glycidoxypropyltriethoxysilane, 2-(3,4-epoxycyclohexyl)ethyltrimethoxysilane, 3-methacryloxypropyltrimethoxysilane, 3-methacryloxypropyltriethoxysilane, reaction products of 3-glycidoxypropyltriethoxysilane and 3-aminopropyltriethoxysilane; condensation reaction products of 3-glycidoxypropyltrimethoxysilane and methylvinylsiloxane oligomer capped with silanol groups; condensation reaction products of 3-methacryloxy- propyltriethoxysilane and methylvinylsiloxane oligomer capped with silanol groups; and tris (3-trimethoxysilylpropyl)isocyan urate.

From the viewpoint of preventing a decrease in resistance to yellowing and in light transparency, when a cured body is used over a long time at elevated temperatures, it is preferable that component (C) does not contain active nitrogen atoms, e.g., amino groups. In certain embodiments, this adhesion promoter is a low-viscosity liquid that has a viscosity at 25° C. in the range of 1 to 500 mPa·s.

Component (C) should be added in amounts that do not impair curing properties, in particular do not cause change of color in a cured body. More specifically, it should be added in an amount of at least 0.01 parts and up to 5 parts by weight, and alternatively at least 0.1 parts by weight, and up to 3 parts by weight, per 100 parts by weight of the sum of components (A) and (B).

Component (D) is a hydrosilylation-reaction catalyst that is used for accelerating hydrosilylation reaction of the composition. Such a catalyst can be exemplified by a platinum-based catalyst, platinum-based compound catalyst, metallic platinum catalyst, rhodium-based catalyst, or a palladium-based catalyst. From the viewpoint of efficient acceleration of the hydrosilylation reaction of components (A) and (B) and thus for accelerated curing of the composition, it is recommended to employ a platinum-based catalyst. Such a catalyst can be represented by fine platinum powder, platinum black, chloroplatinic acid, an alcohol-modified chloroplatinic acid, a diolefin complex of chloroplatinic acid, an olefin complex of platinum; platinum bis (acetoacetate), platinum bis(acetoacetonate), or a similar platinum-carbonyl complex; a complex of chloroplatinic acid and divinyl-tetramethyl disiloxane, a complex of chloroplatinic acid and tetravinyl-tetramethyl-cyclotetrasilane, or a similar complex of chloroplatinic acid and alkenylsiloxane; a complex of platinum and divinyltetramethyl-disiloxane, a complex of platinum and tetravinyltetramethyl-cyclotetrasiloxane, or a similar complex of platinum and alkenylsiloxane; a complex of chloroplatinic acid and acetylene alcohol, etc. From the viewpoint of hydrosilylation efficiency, it is recommended to use a complex of platinum and an alkenylsiloxane.

The alkenylsiloxane may be exemplified by the following compounds: 1,3-divinyl -1,1,3,3-tetramethyldisiloxane; 1,3, 5,7-tetramethyl-1,3,5,7-tetravinyl cyclotetrasiloxane; alkenylsiloxane wherein a part of its methyl groups is substituted with ethyl groups, phenyl groups, etc.; or a similar substituted alkenylsiloxane oligomer; or an alkenylsiloxane oligomer wherein vinyl groups of its alkenylsiloxane are substituted with allyl, hexenyl, or similar groups. Due to the high stability of platinum-alkenylsiloxane complexes, it is recommended to use 1,3-divinyl-1,1,3,3-tetramethyldisiloxane.

Furthermore, in order to further improve the stability of platinum-alkenylsiloxane complexes, they can be combined with 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinylcyclotetrasiloxane, or similar alkenylsiloxane oligomers or organosiloxane oligomers such as dimethylsiloxane oligomers, especially alkenylsiloxane oligomers.

There are no special restriction with regard to the amount in which component (D) can be used, provided that it accelerates curing of the composition. More specifically, it is recommended to add component (D) in such an amount that in terms of weight units the content of platinum-type metal atoms, in particular platinum atoms of this component is in the range of 0.01 to 500 ppm, alternatively 0.01 to 100 ppm, and alternatively 0.1 to 50 ppm. If the content of component (D) is below the recommended lower limit, it will be difficult to provide sufficient curing, and if, on the other hand, the content of component (C) exceeds the recommended upper limit, this will lead to coloration of the cured body.

In order to improve handleability and bonding properties of the composition, it may be further provided with (E) fumed silica having BET specific area in the range of 20 to 200 $m^2/g$. This component should be used in an amount of 1 to 10 parts by weight per 100 parts by weight of the sum of components (A), (B), (C) and (D). If component (E) is used in such an amount that the BET specific area thereof is below or above the recommended range, this will impair handleability and will not allow obtaining a desired viscosity of the composition. Furthermore, if the content of component (E) exceeds the recommended upper limit, this will impair light transmitting properties.

In order to extend the pot life and storage stability at room temperature, the composition can be further provided with component (F) such as 1-ethynylcyclohexan-1-ol, 2-methyl-3-butyn-2-ol, 3,5-dimethyl-1-hexyn-3-ol, 2-phenyl-3-butyn-2-ol, or similar alkyne alcohols; 3-methyl-3-penten-1-yne, 3,5-dimethyl-3-hexen-1-yne, or similar ene-yne compounds; 1,3,5,7-tetramethyl-1,3,5,7-tetravinylcyclotetrasiloxane, 1,3,5,7-tetramethyl -1,3,5,7-tetrahexenylcyclotetrasiloxane, or similar methylalkenylsiloxane oligomers; dimethyl bis(3-methyl-1-butyn-3-oxy)silane, methylvinyl bis(3-methyl-1-butyn-3-oxy)silane, or similar alkynoxysilanes; benzotriazole, or similar hydrosilylation reaction inhibitors.

Component (F) is used in an amount sufficient for inhibiting gelling or curing the composition during mixing of components (A), (B), (C) and (D) and also in an amount needed for providing long-term storage of the composition. More specifically, it is recommended to add this component in an amount of 0.0001 to 5 parts by weight, and alternatively 0.01 to 3 parts by weight per 100 parts by weight of the sum of components (A), (B), (C) and (D).

Within the limits not contradicting with the object of the invention, besides component (E), the composition may contain other arbitrary components such as silica, glass, zinc oxide or similar inorganic fillers; silicone rubber powder;

silicone resin, polymethacrylate resin, or similar resin powders; heat-resistant agents, dyes, pigments, flame retarders, solvents, etc.

From the viewpoint of handling, it is recommended that the composition is liquid and have a viscosity at 25° C. in the range of 10 to 1,000,000 mPa·s. If the composition is intended for use as a sealant for optical semiconductor elements, it should have a viscosity at 25° C. in the range of 100 to 10,000 mPa·s, and if it is intended for use as a bonding agent for optical semiconductor elements, it should have a viscosity at 25° C. in the range of 1,000 to 500,000 mPa·s.

The composition is cured by retaining at room temperature or by heating. For acceleration of curing, it is recommended to cure the composition by heating. The heating temperature should be in the range of 50 to 200° C.

The composition provides excellent bonding durability, with respect to steel, stainless steel, aluminum, copper, silver, titanium, titanium alloy or other metals or alloys; silicon semiconductors, gallium-phosphorus-based semiconductors, gallium-arsenide-based semiconductors, gallium-nitride-based semiconductors, or similar semiconductor elements; ceramics, glass, thermosetting resins, and thermoplastic resins that contain polar groups, and in particular if the above objects are subject to heating-cooling cycles.

It is recommended that curing of the composition produce a cured body having hardness measured by type D durometer in accordance with JIS K 6253 in a range of 30 and the upper limit is higher than the lower limit and up to 60, 65, or 70. If the cured body has the hardness below 30, it will have poor cohesion and insufficient strength and bonding capacity, and if, on the other hand, the hardness exceed 70, a cured body will acquire brittleness, and it will be impossible to provide sufficient bonding properties. In certain embodiments, the cured body may have hardness of at least 40, 50, 55, or 60.

The following is a detailed description of an optical semiconductor device of the invention.

The optical semiconductor device of the invention comprises an optical semiconductor element that is either sealed in a housing by a cured body of a sealing material formed from the composition of the present invention, or is bonded to the housing with a cured body of a bonding material formed from the composition of the invention. The optical semiconductor element may comprise a light-emitting diode (LED), semiconductor laser, photodiode, photo transistor, solid-state image pickup elements, or a photo-coupler light emitter and receiver. Most suitable application is a LED.

Since in a LED the light is emitted from the semiconductor in a vertical and in a horizontal direction, it is required that the parts of the device be made from materials that do not absorb the light and have either high light transmittance or high coefficient of light reflection. A substrate that supports the optical semiconductor element is also not an exception from this rule. Such a substrate can be made from silver, gold, copper, or another electrically conductive metal; aluminum, nickel or another non-electroconductive metal; PPA (Polyphthalamide), LCP (Liquid Crystal Polymer), or another thermoplastic resin mixed with a white pigment; epoxy resin, BT resin, polyimide resin, silicone resin, or a similar thermosetting resin mixed with a white pigment; alumina, alumina nitride, or similar ceramics. Since the composition of the invention provides good bonding to semiconductor elements and substrates, it improves reliability of the obtained optical semiconductor device.

Figure 1:
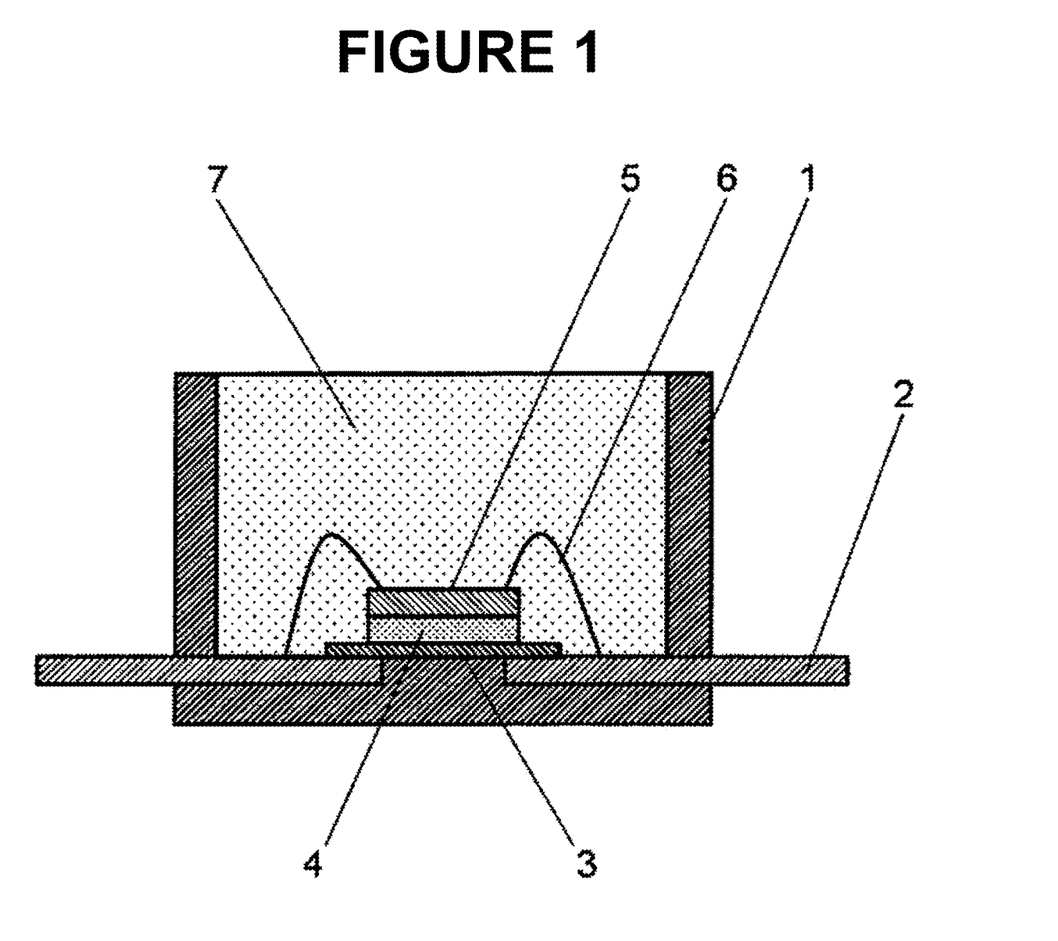
FIG. 1 is a sectional view of a surface-mount light emitting diode (LED) illustrated as an example of an optical semiconductor device of the invention.

The optical semiconductor device of the invention is described in more detail with reference to FIG. 1. FIG. 1 is a sectional view of a single surface-mount type LED shown as a typical example of an optical semiconductor device. The LED of FIG. 1 comprises a LED chip 5 which is die-bonded to a die pad 3 through a bonding material 4 inside a housing 1 made from a polyphthalamide resin (PPA). The LED chip 5, in turn, is wire-bonded to inner leads 2 by bonding wires 6, and along with the inner walls of the housing are sealed with a sealing material 7. In the LED of the invention, the composition that is used for forming the bonding material 4 and/or the sealing material 7 is the curable organopolysiloxane composition of the present invention.

INDUSTRIAL APPLICABILITY

The curable organopolysiloxane composition of the invention can be used as a sealant and a bonding agent for optical semiconductor elements of LEDs, semiconductor lasers, photodiodes, photo transistors, solid-state image pickup elements, photo-coupler light emitters and receivers, etc. The optical semiconductor devices of the invention may be used as optical devices, optical instruments, lighting devices, illumination devices, or similar optical semiconductor devices.

EXAMPLES

The curable organopolysiloxane composition of the present invention and the optical semiconductor device of the invention will be further illustrated in more details with reference to application and comparative examples. In these application and comparative examples, the values of viscosity corresponds to 25° C.

Viscosity of the curable organopolysiloxane compositions, as well as hardness, light transmittance, and bonding strength of the cured bodies mentioned in the application and comparative examples were measured by the methods described below.

[Viscosity of the Curable Organopolysiloxane Composition]

This characteristic was measured after the preparation of the curable organopolysiloxane composition within 30 min. by means of a viscometer (AR-550, the product of TA Instrument Co., Ltd.) and by using a 2° cone plate of 20 mm diameter. The viscosities were measured in shear rates of 1 sec-1 and 10 sec-1 after applying pre-shear firstly. Thixotropy which is defined as shear dependent viscosity change is determined by dividing the viscosity at 1 sec-1 with that at 10 sec-1.

[Hardness of Cured Body]

The curable organopolysiloxane was formed into a cured sheet-like body by press forming for 1 hour at 150° C., and the latter was used for measuring hardness with type D durometer according to JIS K 6253.

[Light-Transmitting Properties of Cured Body]

The curable organopolysiloxane composition was sandwiched between two glass plates and cured by holding it for 1 hour at 150° C. Light-transmitting properties of the obtained cured body were measured at 25° C. by a self-recording spectrophotometer (optical path: 0.1 cm) capable of measuring at any wavelength of visible light (the wavelength range of 400 nm to 700 nm). Light transmission through the cured body was determined by subtracting light transmission through the glass only from light transmission through the glass and the composition. The light transmittance obtained for wavelength 450 nm is shown in Table 1.

[Pad Contamination of a Device]

A 10 mm by 10 mm square gold chip and a 100 mg curable organopolysiloxane composition were placed in an ampoule separated by a space of about 20 mm and the ampoule was sealed and placed in an oven, which was heated from room temperature up to 170 degrees Celsius in 30 minutes, and further maintained at 170 degrees Celsius for 30 minutes to cure the organopolysiloxane composition. The discoloration of the gold chip was visually checked and rated in four grades, +++ being highly contaminated, ++ being somewhat contaminated, + being contamination observable, and no contamination.

Practical Examples 1 to 4, Comparative Example 1

Listed below are formulas of the constituents that were used for the preparation of curable organopolysiloxane compositions shown in the application and comparative examples, wherein Vi stands for vinyl groups, Me stands for methyl groups; Vi % shows the percentage of vinyl groups (mole %) in all organic groups.

Constituent (a-1): organopolysiloxane (Vi %=2.06 mole %) having viscosity of 60 mPa·s and represented by the following average compositional formula: $(Me_2ViSiO_{1/2})_{0.042}(Me_2SiO_{2/2})_{0.958}$ Constituent (a-2): organopolysiloxane (Vi %=50 mole %) having viscosity of 4 mPa·s and represented by the following average molecular formula: $(MeViSiO_{2/2})_4$ Constituent (a-3): organopolysiloxane (Vi %=33 mole %) represented by the following molecular formula: $(MeViSiO_{1/2})_4(SiO_{4/2})_1$ Constituent (a-4): organopolysiloxane (Vi %=5.8 mole %) which is solid at 25° C. and is represented by the following average compositional formula: $(Me_2ViSiO_{1/2})_{0.09}(Me_3SiO_{1/2})_{0.43}(SiO_{4/2})_{0.48}(HO_{1/2})_{0.03}$ Constituent (b-1): organopolysiloxane which has viscosity of 20 mPa·s, contains 1.5 wt. % of silicon-bonded hydrogen atoms, and is represented by the following average molecular formula: $Me_3SiO(MeHSiO)_{10}SiMe_3$ Constituent (b-2): organopolysiloxane which has viscosity of 120 mPa·s, contains 1.03 wt. % of silicon-bonded hydrogen atoms, and is represented by the following average compositional formula: $(HMe_2SiO_{1/2})_{0.67}(SiO_{4/2})_{0.33}$ Constituent (c): condensation reaction product of 3-glycidoxypropyltrimethoxysilane and methylvinylsiloxane oligomer capped at both molecular terminals with silanol groups and having viscosity of 30 mPa·s.

Constituent (d): 1.3-divinyl-1,1,3,3-tetramethyldisiloxane solution of complex of platinum and 1,3-divinyl-1,1,3,3-tetramethyldisiloxane (contains about 4 wt. % of metallic platinum)

Constituent (e): fumed silica having BET surface area in the range of 190 to 210 m²/g and hydrophobized by surface treatment with hexamethyl disilazane (RX300, the product of Nippon Aerosil Co., Ltd.)

Constituent (f): hydrosilylation reaction inhibitor alkyoxysilane

Figure 2:
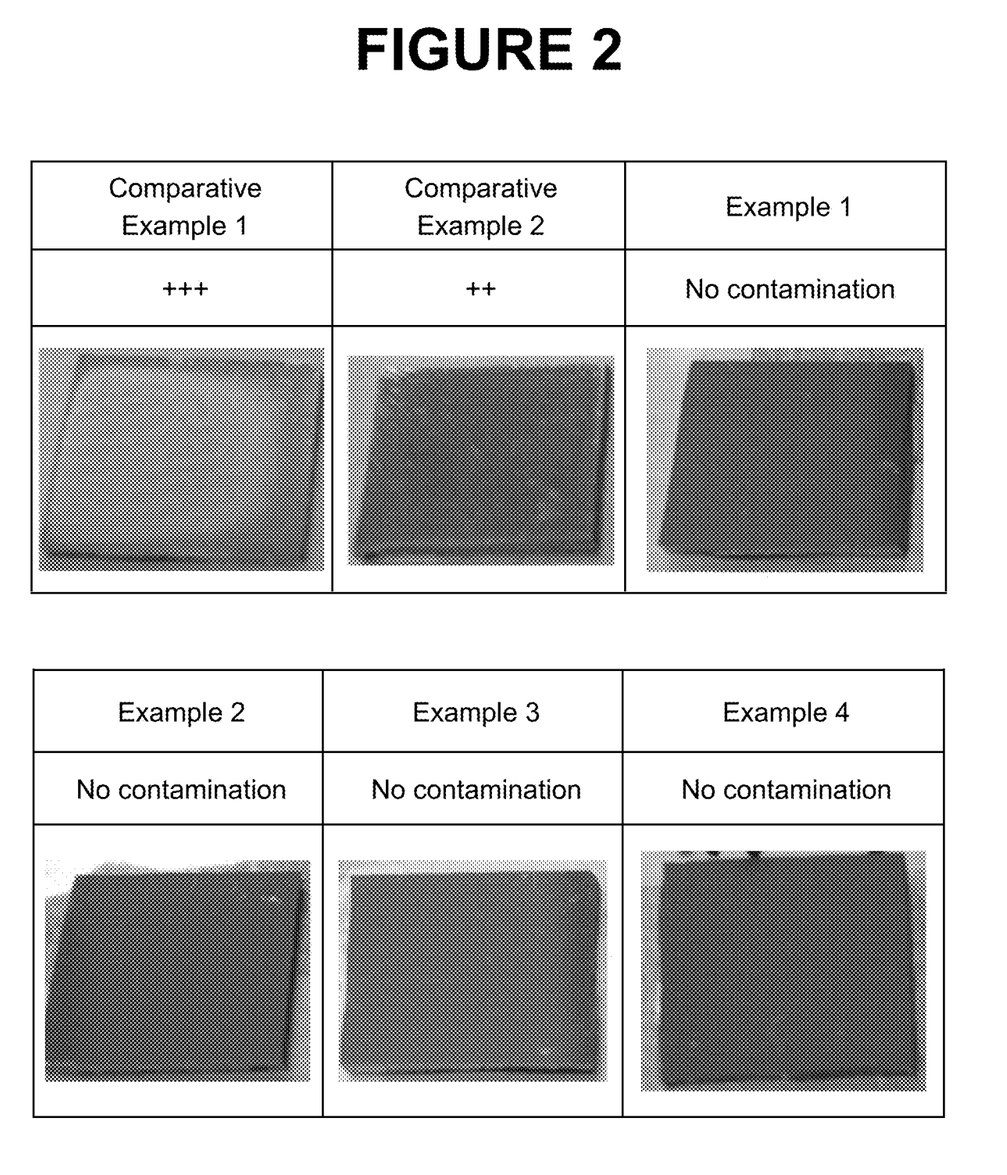
FIG. 2 is a set of photographs showing the results of gold pad contamination test.

Curable organopolysiloxane compositions were prepared with component ratios shown in Table 1. The resulting materials' properties are described in Table 2. The visual representation of pad contamination is provided as FIG. 2.

TABLE 1

|  | Comparative Example 1 | Practical Example 1 | Practical Example 2 | Practical Example 3 | Practical Example 4 |
| --- | --- | --- | --- | --- | --- |
| Constituent (a-1) | 9.3 | 15.6 | 16.3 | 15.9 | 17.2 |
| Constituent (a-2) | 7.8 | 3.1 | 4.6 | 3.7 | 3.1 |
| Constituent (a-3) | 0 | 3 | 0 | 0 | 0 |
| Constituent (a-4) | 63.8 | 60.8 | 63.8 | 62.0 | 67.0 |
| Constituent (b-1) | 1 | 12 | 9.8 | 11.9 | 7.3 |
| Constituent (b-2) | 12.7 | 0 | 0 | 0 | 0 |
| Constituent (c) | 0.75 | 0.75 | 0.75 | 0.75 | 0.75 |
| Constituent (d) | 0.05 | 0.1 | 0.1 | 0.1 | 0.1 |
| Constituent (e) | 4.6 | 4.6 | 4.6 | 5.6 | 4.6 |
| Constituent (f) | 0.06 | 0.03 | 0.03 | 0.03 | 0.03 |
| Total | 100 | 100 | 100 | 100 | 100 |

TABLE 2

| Sample ID | Comparative Example 1 | Practical Example 1 Low Viscosity | Practical Example 2 Low Viscosity | Practical Example 3 Moderate Viscosity | Practical Example 4 High Viscosity |
| --- | --- | --- | --- | --- | --- |
| Viscosity @ 1/s Pa · s | 16.7 | 15.4 | 17.6 | 25.0 | 33.3 |
| Viscosity @ 10/s Pa · s | 6.0 | 3.6 | 4.2 | 6.2 | 10.2 |
| Thixo Ratio [1/s]/[10/s] | 2.8 | 4.3 | 4.2 | 4.0 | 3.3 |
| Cured Hardness (Shore D) | 63 | 56 | 56 | 56 | 54 |
| ts1 (by MDR @ 150° C.) min. | 2.7 | 1.5 | 1.7 | 1.2 | 2.7 |
| Light Transmittance 450 nm/550 nm | 94.76/94.51 | — | 96.42/97.29 | — | 94.95/96.39 |
| Pad Contamination | +++ | None | None | None | None |

The terms "comprising" or "comprise" are used herein in their broadest sense to mean and encompass the notions of "including," "include," "consist(ing) essentially of," and "consist(ing) of." The use of "for example," "e.g.," "such as," and "including" to list illustrative examples does not limit to only the listed examples. Thus, "for example" or "such as" means "for example, but not limited to" or "such as, but not limited to" and encompasses other similar or equivalent examples. The term "about" as used herein serves to reasonably encompass or describe minor variations in numerical values measured by instrumental analysis or as a result of sample handling. Such minor variations may be in the order of ±0-25, ±0-10, ±0-5, or ±0-2.5, % of the numerical values. Further, The term "about" applies to both numerical values when associated with a range of values. Moreover, the term "about" may apply to numerical values even when not explicitly stated.

Generally, as used herein a hyphen "-" or dash "-" in a range of values is "to" or "through"; a ">" is "above or

"greater-than"; a "≥" is "at least" or "greater-than or equal to"; a "<" is "below" or "less-than"; and a "≤" is "at most" or "less-than or equal to." On an individual basis, each of the aforementioned applications for patent, patents, and/or patent application publications, is expressly incorporated herein by reference in its entirety in one or more non-limiting embodiments.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and or in combination and provides adequate support for specific embodiments within the scope of the appended claims.

It is also to be understood that any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

The present invention has been described herein in an illustrative manner, and it is to be understood that the terminology which has been used is intended to be in the nature of words of description rather than of limitation. Many modifications and variations of the present invention are possible in light of the above teachings. The present invention may be practiced otherwise than as specifically described within the scope of the appended claims. The subject matter of all combinations of independent and dependent claims, both single and multiple dependent, is herein expressly contemplated.

What is claimed is:
1. A curable organopolysiloxane composition comprising:
(A) an alkenyl-containing organopolysiloxane that comprises 15 to 35 wt. % of constituent (A-1) and 65 to 85 wt. % of constituent (A-2), wherein
constituent (A-1) comprises an organopolysiloxane of the following average compositional formula:

where $R^1$ designates phenyl groups, methyl groups, or alkenyl groups having 2 to 10 carbon atoms; 0.4 to 50 mole % of all $R^1$ groups are alkenyl groups having 2 to 10 carbon atoms; methyl groups constitute 90 mole % or more of the sum of methyl and phenyl groups contained in $R^1$; "a", "b", "c", and "d" are numbers that satisfy the following conditions: $0 \leq a \leq 0.05$; $0.9 \leq b \leq 1$; $0 \leq c \leq 0.03$; $0 \leq d \leq 0.03$; and $a+b+c+d=1$;
constituent (A-2) comprises an organopolysiloxane of the following average compositional formula:

where $R^2$ designates phenyl groups, methyl groups, or alkenyl groups having 2 to 10 carbon atoms;
5 to 10 mole % of all $R^2$ groups are alkenyl groups having 2 to 10 carbon atoms; methyl groups constitute 90 mole % or more of the sum of methyl and phenyl groups contained in $R^2$; "e", "f", "g", "h" and "i" are numbers that satisfy the following conditions: $0.4 \leq e \leq 0.6$; $0 \leq f \leq 0.05$; $0 \leq g \leq 0.05$; $0.4 \leq h \leq 0.6$; $0.01 \leq i \leq 0.05$; and $e+f+g+h=1$;
(B) an organopolysiloxane that contains silicon-bonded hydrogen atom and comprises 80 to 100 wt. % of constituent (B-1), 0 to 20 wt. % of constituent (B-2), and 0 to 10 wt. % of constituent (B-3); in an amount that the silicon-bonded hydrogen atoms in component (B) are in the range of 0.5 to 2.0 moles per 1 mole of the total content of alkenyl groups in component (A), wherein
constituent (B-1) comprises an organopolysiloxane that contains at least 0.5 wt. % of silicon-bonded hydrogen atoms and that is represented by the following average molecular formula:

where $R^3$ designates phenyl groups or methyl groups; methyl groups constitute 90 mole % or more of all groups contained in $R^3$; "j" is a number in the range of 0 to 35; and "k" is a number in the range of 10 to 100;
constituent (B-2) comprises an organopolysiloxane that contains at least 0.5 wt. % of silicon-bonded hydrogen atoms and that is represented by the following average compositional formula:

where $R^4$ designates phenyl groups or methyl groups; methyl groups constitute 90 mole % or more of all groups contained in $R^4$; $R^5$ designates hydrogen atoms or alkyl groups having 1 to 10 carbon atoms; and "l", "m", "n", "o", "p" and "q" are numbers that satisfy the following conditions: $0.4 \leq l \leq 0.7$; $0 \leq m \leq 0.2$; $0 \leq n \leq 0.05$; $0 \leq o \leq 0.5$; $0.3 \leq p \leq 0.6$; $0 \leq q \leq 0.05$; and $l+m+n+o+p=1$;
constituent (B-3) is an organopolysiloxane represented by the following average molecular formula:

where $R^6$ represents phenyl or methyl groups; methyl groups constitute at least 90% of all groups contained in $R^6$; and "r" is a number in the range of 10 to 100;

(C) an adhesion promoter in an amount of 0.1 to 5 parts by weight per 100 parts by weight of the sum of components (A) and (B); and (D) a hydrosilylation-reaction catalyst, in an amount sufficient for curing the composition.

2. The curable organopolysiloxane composition of claim 1, further comprising:

(E) fumed silica having BET specific area of 20 to 200 m²/g and present in an amount of from 1 to 10 parts by weight per 100 parts by weight of the sum of components (A) to (D).

3. A cured body formed from the curable organopolysiloxane composition of claim 1, wherein the cured body has a type D durometer hardness in the range of 30 to 70 according to JIS K 6253.

4. The cured body of claim 3, having a type D hardness in the range of 55 to 70 according to JIS K 6253.

5. A sealant or a bonding agent for optical semiconductor elements, wherein the sealant or bonding agent comprises or is formed from the curable organopolysiloxane composition of claim 1.

6. The sealant or bonding agent of claim 5, wherein the optical semiconductor elements are light emitting diodes.

7. An optical semiconductor device comprising an optical semiconductor element, wherein the optical semiconductor element is sealed and/or bonded with a cured body, and wherein the cured body is formed from the curable organopolysiloxane composition of claim 1.

* * * * *